United States Patent [19]

Kaplan et al.

[11] Patent Number: 5,438,192
[45] Date of Patent: Aug. 1, 1995

[54] PHOTODYNAMIC PROTEIN-BASED PHOTODETECTOR AND PHOTODETECTOR SYSTEM FOR IMAGE DETECTION AND PROCESSING

[75] Inventors: David L. Kaplan, Stow; Lynne A. Samuelson, West Newton, both of Mass.; Bonnie J. Wiley, Cambridge, Ill.; Kenneth A. Marx, Francestown, N.H.; Jayant Kumar, Lowell; Sukant K. Tripathy, Acton, both of Mass.; Sandip K. Sengupta, Nashua; Mario J. Cazeca, Hudson, both of N.H.

[73] Assignee: The United States of America as represented by the Secretary of the Army, Washington, D.C.

[21] Appl. No.: 166,398

[22] Filed: Dec. 9, 1993

[51] Int. Cl.$^6$ .............................................. H01J 40/14
[52] U.S. Cl. .................................. 250/214.1; 430/340
[58] Field of Search ................... 250/214.1; 136/243, 136/244, 245, 252, 263; 430/340

[56] References Cited

U.S. PATENT DOCUMENTS

| | | | |
|---|---|---|---|
| 4,514,584 | 4/1985 | Fox et al. | 136/263 |
| 4,707,454 | 11/1987 | Hendrix | 436/546 |
| 4,762,881 | 8/1988 | Kauer | 525/54.11 |
| 4,804,834 | 2/1989 | Katsura et al. | 250/211 R |
| 4,965,174 | 10/1990 | Arai et al. | 430/340 |
| 5,024,520 | 6/1991 | Akiyama | 351/221 |
| 5,120,649 | 6/1992 | Horowitz | 435/173 |
| 5,252,719 | 10/1993 | Takeda et al. | 530/409 |
| 5,260,004 | 9/1993 | Samuelson et al. | 264/22 |

OTHER PUBLICATIONS

Petty, M. C., "Application of multilayer films to molecular sensors:Some examples of bioengineering at the molecular level", Journal of Biomedical Engineering, vol. 13, Issue 3, pp. 209–214, 1991.

Primary Examiner—David C. Nelms
Assistant Examiner—Steven L. Nichols
Attorney, Agent, or Firm—Richard J. Donahue; Vincent J. Ranucci

[57] ABSTRACT

A photodetection device uses configurations of photodynamic proteins which exhibit a change in electrical conductivity in response to a corresponding change in incident light intensity in the presence of an applied voltage. The photodynamic proteins are coupled to an electrical conductor, a voltage source and a conductivity sensor. The photodynamic protein complex includes at least one layer of a photodynamic protein and preferably includes a multi-layered thin-film structure with each layer comprised of either a photodynamic protein or a conductive polymer or oligomer. Groups of linked photodetectors where the photodetectors have different, but overlapping, spectral response ranges are used to detect specific wavelengths of incident light. An array of these groups of linked photodetectors arranged in a predetermined spatial pattern allows detection of both colon and images. An image processing system is constructed from this array of groups of linked photodetectors by coupling the output of the array to a processing component and the output of the processing component to an output device. A dynamic adaptive camouflage system is derived from the image processing system by mounting the photodetectors and display devices on an apparatus to be camouflaged and displaying a spatially shifted image of the incident ambient light.

1 Claim, 3 Drawing Sheets

PHOTODYNAMIC PROTEIN-BASED PHOTODETECTOR AND PHOTODETECTOR SYSTEM FOR IMAGE DETECTION AND PROCESSING

FIELD OF THE INVENTION

This invention relates to photodetectors and in particular, to photodetectors which function as a result of the photoconductive effects produced by various configurations of photodynamic proteins and to the use of such photodetectors for image detection, image processing, and dynamic camouflage applications.

BACKGROUND OF THE INVENTION

Photodetectors are used for image detection, in particular to monitor activity such as movement or other changes in the image being detected. Output of photodetectors is often used as the input for image processing in order to initiate responses to what is detected. Among other applications, photodetectors are commonly used in biosensors for medical diagnostic and related fields. Current photodetection technology uses silicone-based and photochromic-based detection systems.

There are a number of limitations to current photodetection technology. Existing photodetectors are generally damaged by high energy levels, including high levels of incident light. They generally also exhibit a lack of detection sensitivity and a limited detection range. This lack of sensitivity can make coupling of specific inputs to specific outputs difficult, meaning there is no "fine tuning" Existing photodetectors are restricted to rigid materials for detection and display. There are also maximum size limitations for the detectors themselves and for arrays of detectors. In addition, the most stable photochromic materials currently used darken in response to light rather than having optical densities which decrease as light intensity increases.

Recently methods have been sought to utilize photodetection technology for dynamic camouflage applications. The goal is to develop a color display capable of changing pattern and color with similar changes in the surrounding environment. The current method of providing camouflage is permanent coloring of the object to be camouflaged. The limitations of current photodetection technology when applied to camouflage applications include the limited range of light intensity which can be detected, the limited amount of color discrimination which is available, the lack of robustness of current technology photodetectors, the inability to apply the photodetectors in conformal coatings, and the fact that the change in color of current photochromic materials is in the "wrong" direction.

The photovoltaic properties of certain proteins has been previously known, but these proteins have not been utilized in photodetector technology. Use of photodynamic proteins in photodetectors could provide several advantages. They would allow a broad photodynamic detection range and possibly increased robustness (ruggedness) over current photodetectors. They would also give the ability to form detectors or arrays of unlimited size. In addition, multi-component photodynamic protein-based photodetector groups can be tailored to receive specific wavelengths of light. Certain photodynamic proteins also exhibit the desired direction of color change in response to light intensity, such that optical density decreases as light intensity increases, which would allow their use for photochromic display applications such as camouflage. Photodynamic protein-based photodetectors could also be used in conformal coatings.

SUMMARY OF THE INVENTION

This invention features a photodetection device which uses a configuration of light-reactive (photodynamic) proteins which, when in the presence of an applied voltage, exhibit a change in electrical conductivity in response to a corresponding change in incident light intensity. The photodetector includes a light-reactive protein complex having at least one layer of light-reactive protein. This light-reactive protein complex is then coupled to an electrical conductor and a voltage source which provides a predetermined applied voltage across the light-reactive protein complex. A conductivity sensor coupled to the electrical conductor senses the change in electrical conductivity across the light-reactive protein complex and provides a signal which can be linked to an image processing and display system.

In the preferred embodiment, the light-reactive protein complex is a multi-layered thin-film and the light-reactive proteins may include Bacteriorhodopsin, *Halobacterium halobium* purple membrane fragments, and phycobiliproteins. The preferred embodiment also includes layers of conductive polymers or oligomers to improve electrical conduction, and all the layers are specifically directed into a predetermined configuration and orientation to facilitate unidirectional energy transfer. The electrical conductor may be coupled to the light-reactive protein complex through covalent linkage or thin-film resonance transfer. The photodynamic protein-based photodetector of the present invention can be applied as a conformal coating to selected materials, including a cloth-like material such as a tent.

Groups of linked photodynamic protein-based photodetectors of the present invention may be tailored so that the photodetectors have different, but overlapping, spectral response ranges to allow detection of specific wavelengths of incident light. In the preferred embodiment, the spectral responses are tailored to allow detection of the color of incident ambient light. An array of these groups of linked photodynamic protein-based photodetectors, arranged in a predetermined spatial pattern, allows detection of both color and images.

An image processing system is constructed from this array of groups of linked photodynamic protein-based photodetectors by coupling the output of the array to a processing component and the output of the processing component to one or more output devices. In the preferred embodiment, the output devices include visual display devices such as a passive reflective transducer, an active transducer, or photochromic material, and display changes in color of the incident ambient light.

A dynamic adaptive camouflage system is derived from this image processing system by mounting the photodetectors and display devices on an apparatus to be camouflaged and processing the photodetector output to display a spatially shifted image of the incident ambient light. In the preferred embodiment, the output devices would be liquid crystal or photochromic displays.

DESCRIPTION OF THE DRAWINGS

These, and other features and advantages of the present invention will be better understood by reading the following detailed description, taken together with the drawings wherein.

DETAILED DESCRIPTION OF THE INVENTION

Figure 1:
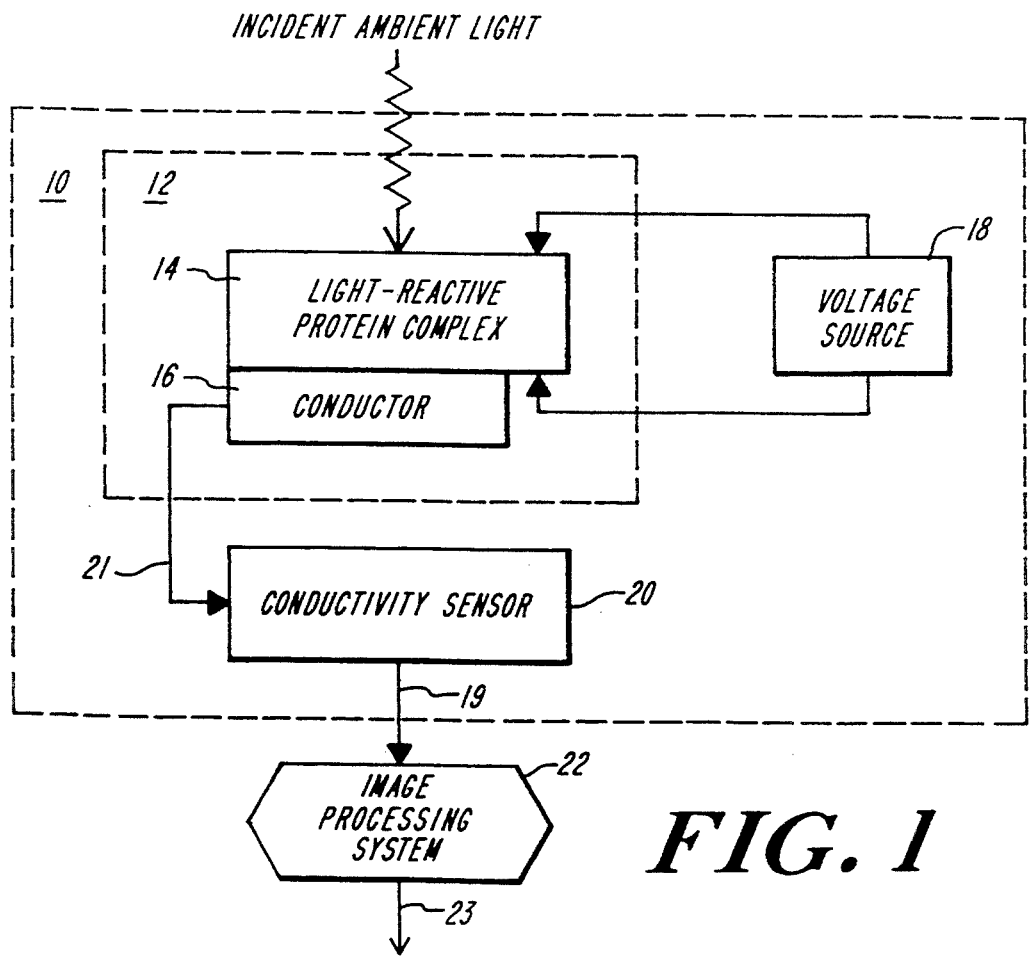
FIG. 1 is a block diagram of the photodynamic protein-based photodetector system according to the present invention.

The photodynamic protein-based photodetctor system 10 FIG. 1, according to the present invention includes a photodynamic protein-based photodetector 12 comprised of a light-reactive protein complex 14 coupled to an electrical conductor 16. The light-reactive protein complex 14 is composed of a configuration of at least one light-reactive protein and exhibits a change in electrical conductivity in response to a corresponding change in incident light intensity when a voltage in the range of 10 to 50 volts is applied by voltage source 18. This change in electrical conductivity in the light-reactive protein complex 14 is transmitted over signal path 21 and transferred by the electrical conductor 16 to a conductivity sensor 20. The output signal 19 of the conductivity sensor 20 is then coupled to and processed by the specialized image processing system 22, resulting in an image-processed output 23.

The electrical conductor 16 is typically a conductive polymer or an electrode. If it is a conductive polymer, the electrical conductor 16 can be coupled to the light-reactive protein complex 14 either through a chemical link such as a covalent bond, or a physical link such as would allow for molecular resonance transfer of energy. If the electrical conductor 16 is an electrode, such as shown for the embodiment of the electrical conductor 16 in FIG. 2, the coupling to the light-reactive protein complex 14 is made through direct physical contact.

Figure 2:
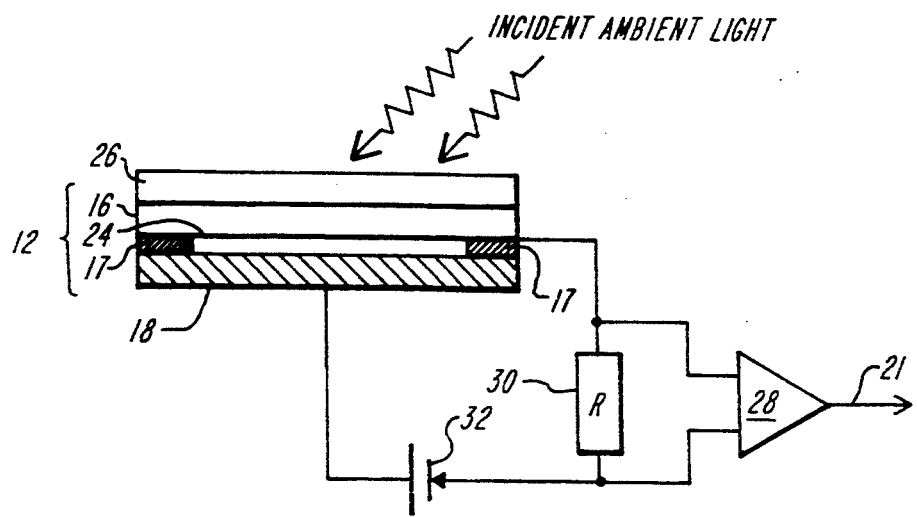
FIG. 2 is one implementation of a photodynamic protein-based photodetector according to the present invention.

A sample implementation of the photodynamic protein-based photodetector system 10 is shown in FIG. 2. The photodynamic protein-based photodetector 12 is comprised of a light-reactive protein complex which is a layer of a single light-reactive protein 24 surrounded on the side by spacer 17, and an electrical conductor 16 which is a transparent electrode. A predetermined voltage is applied to the light-reactive protein 24 by the voltage source 32 via an electrode 18 connected through a capacitor 32 to a feedback amplifier 28 and through the electrical conductor 16 across a resistance 30.

The change in electrical conductivity of the light-reactive protein complex 14 in response to a corresponding change in incident ambient light intensity in the presence of the voltage supplied by voltage source 18 is determined across resistance 30 and provided to a conductivity sensor over signal path 21.

Incident ambient light is initially limited to the desired range of wavelength by passing through band pass filter 26 before subsequently passing through the transparent electrical conductor 16 onto light-reactive protein 24 and inducing the change in electrical conductivity in the presence of the applied voltage from voltage source 18.

Figure 3:
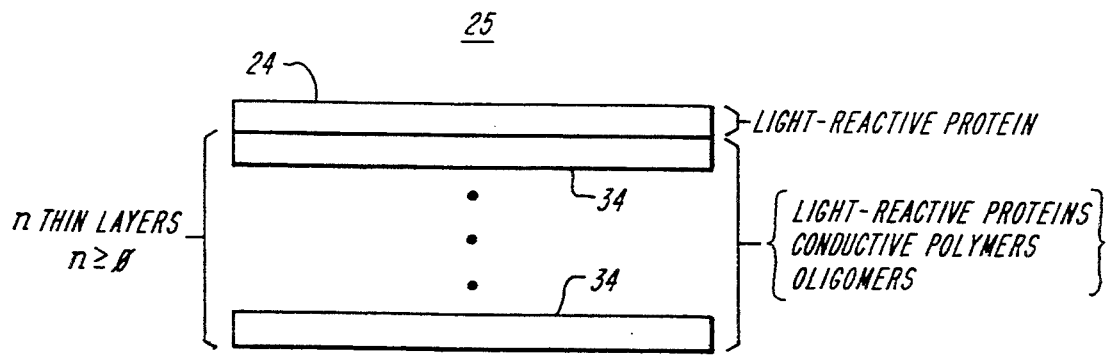
FIG. 3 is a representation of an exemplary configuration of photodynamic proteins, conductive polymers and oligomers within the light-reactive protein complex of a single photodynamic protein-based photodetector according to the present invention.

The preferred embodiment of the light-reactive protein complex of the present invention is a multi-layered thin-film 25 as shown in FIG. 3. A thin-film layer of a single light-reactive protein 24 is placed on top of one or more stacked thin-film layers 34, with each additional layer consisting of either a single layer of light-reactive protein or a single layer of an oligomer or conductive polymer. Use of oligomer or conductive polymer additional layers 34 operates to enhance the electrical conductivity of the light-reactive protein complex as a whole, as does aligning the thin-film layers 34 in a predetermined manner, and all layers are specifically directed into a predetermined configuration and orientation to facilitate unidirectional energy transfer. In the preferred embodiment the light-reactive protein is selected from the group including phycobiliproteins, Bacteriorhodopsin and Halobacterium halobium purple membrane fragments, and the thin-film layers 34 may include some layers of both conductive polymers and oligomers.

Figure 4:
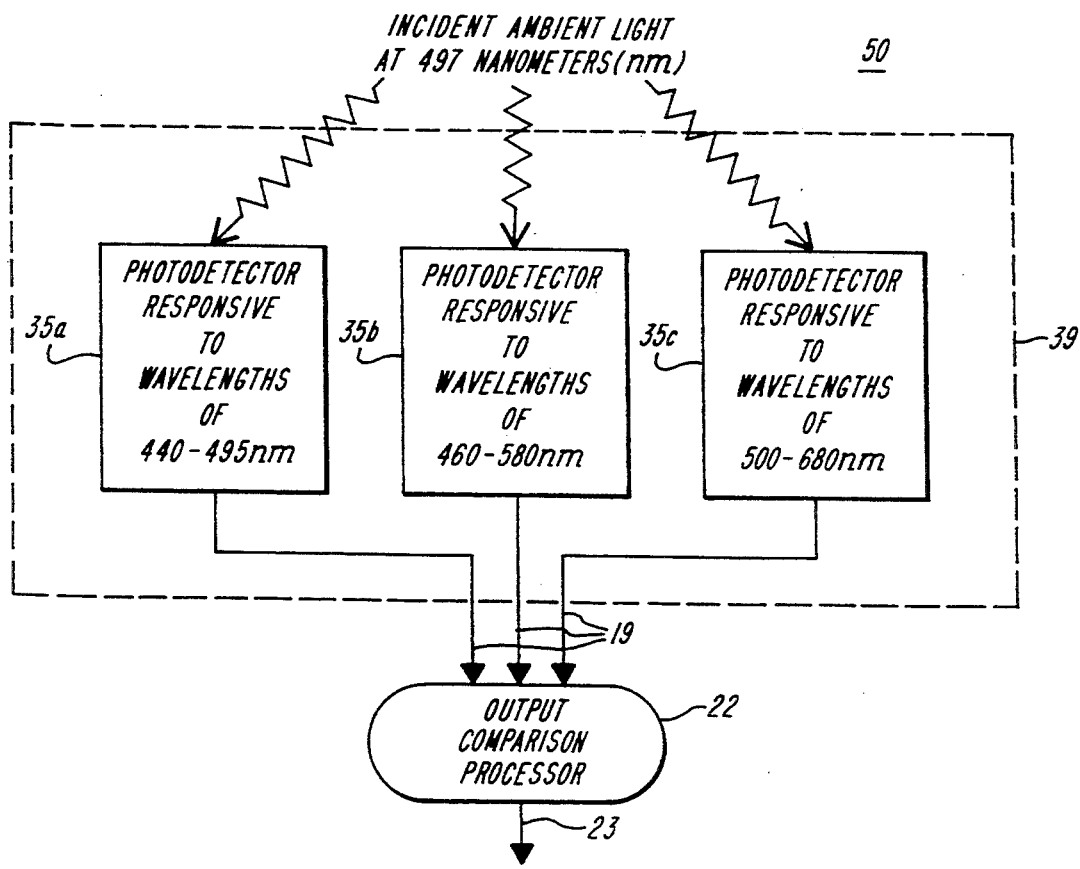
FIG. 4 is a block diagram of a group of linked photodynamic protein-based photodetectors forming a system with different spectral responses which have been tailored to detect a specific incident light wavelength according to one aspect of the present invention.

Color detection can be accomplished by utilizing a group of photodynamic protein-based photodetectors to form a system 50, FIG. 4, arranged at a single location. Each photodynamic protein-based photodetector configuration 35a–35c is responsive to a different spectral range of incident ambient light. In addition, the spectral ranges overlap so as to allow a specific ambient light wavelength to be identified.

In FIG. 4, the outputs of three configurations of photodynamic protein-based photodetectors 35a–35c are arranged as a group of linked photodetectors to form system 39 which is coupled to an image processing system 22 which consists of an output comparison processor. The system in FIG. 4 will produce a "positive" image-processed output signal 23 only for incident ambient light at wavelengths between 495 and 500 nm.

Image detection can be accomplished by arranging a plurality of the configurations of photodynamic protein-based photodetectors 35a–35c in a predetermined spacial pattern, and coupling the outputs 19 of each of the configurations 35a–35c to a single image processing system 22. Image and color detection at the same time can be achieved by using a plurality of groups 39 of linked photodetector configurations 35a–35c arranged in a predetermined spacial pattern and by coupling the image-processed outputs 23 of each group of linked photodetector systems to a single image processing system.

Figure 5:
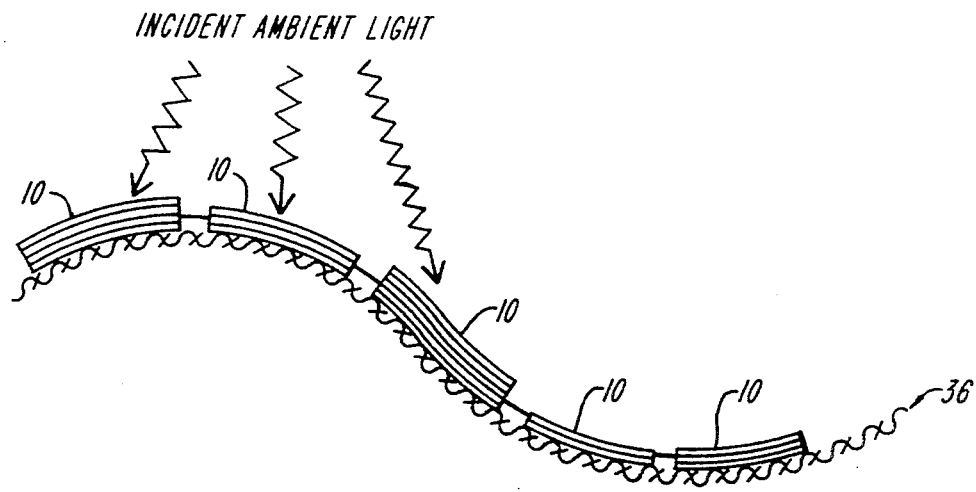
FIG. 5 is a representation of a photodynamic protein-based photodetector system applied as a conformal coating on a flexible material according to another aspect of the present invention.

The photodynamic protein-based photodetectors 10 of the present invention can be applied as a conformal coating on a flexible material 36, FIG. 5, such as a tent. This has particular potential usefulness in dynamic adaptive camouflage systems because the photodynamic protein-based photodetector system 10 can thereby be usefully applied to such materials as clothing and tent cloth.

Figure 6:
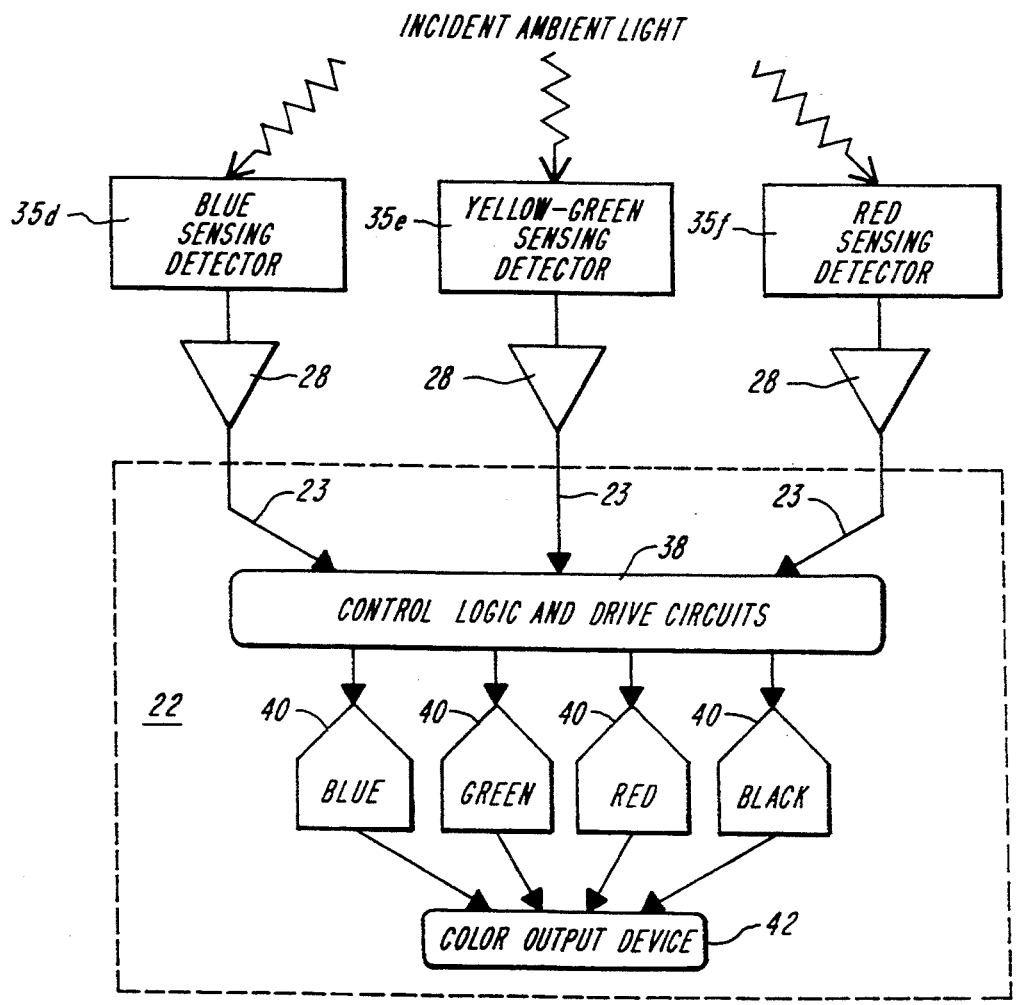
FIG. 6 is a block diagram of a dynamic adaptive camouflage system according to the present invention.

The preferred embodiment of a dynamic adaptive camouflage system is shown in FIG. 6. Several groups of linked photodetector systems 35d–35f, each of which is tailored to detect a specific color (wavelength) of incident ambient light, are coupled through amplifiers 28 to an image processing system 22 which includes control logic and drive circuits 38. The outputs from the control logic and drive circuits are coupled through color transducers 40 to a color output device 42 and the image processing system 22 produces a spatially shifted replica of the surrounding environment on the color output device 42. In the preferred embodiment, the color output device is composed of either passive reflective transducers, such as liquid crystal displays, or of photochromic materials in order to allow blending into the surrounding environment. Active transducers, such as light emitting diodes. (LED's), may also be utilized.

Accordingly, the present invention provides a novel design for a photodetection device which functions as a result of the photoconductive properties of photodynamic proteins and which allows for detection and discrimination of a wide range of incident light intensities and wavelengths. Groups of photodetection devices according to the present invention, designed with different spectral responses and spatial configurations, allow for color and image detection. When coupled to passive output devices and an image processing system that produces a spatially shifted replica of the photodetection device output, groups of photodetection devices according to the present invention provide a system for dynamic adaptive camouflage.

Modifications and substitutions by one of ordinary skill in the art are considered to be within the scope of the present invention which is not to be limited except by the claims which follow.

What is claimed is:

1. A dynamic adaptive camouflage system comprising:
    a plurality of groups of linked photodynamic protein-based photodetectors, each said group of linked photodynamic protein-based photodetectors responsive to a predetermined wavelength of incident light;
    each of said linked photodynamic protein-based photodetector including a configuration of at least one light-reactive protein exhibiting a change in electrical conductivity in response to a corresponding change in said incident light intensity in the presence of an applied voltage;
    said configuration of at least one light-reactive protein includes a multi-layered thin-film, each layer of said multi-layered thin-film being selected from the group consisting of light-reactive proteins, conductive polymers and oligomers, said multi-layered thin-film being oriented in a predetermined manner, and all the layers are specifically directed into a predetermined configuration and orientation to facilitate undirectional energy transfer;
    each of said plurality of photodynamic protein-based photodetectors having a different spectral response range, said spectral response range of at least a first one of said plurality of photodynamic protein-based photodetectors overlapping with a spectral response range of at least a second one of said plurality of protein-based photodetectors, said overlapping spectral response range allowing detection of a specific wavelength of said incident light;
    an electrical conductor, comprising a conductive polymer, coupled to said at least one light-reactive protein, said conductive polymer being coupled to said at least one light reactive protein in a manner selected from the group consisting of covalent linkage and thin film resonance transfer;
    a voltage source, for providing a predetermined applied voltage across said configuration of at least one light-reactive protein;
    a conductivity sensor, coupled to said electrical conductor for sensing said change in electrical conductivity in said configuration of at least one light-reactive protein in response to a corresponding change in said incident light intensity and for providing an output signal;
    means, coupled to said conductivity sensor, for processing said output signal; and
    at least one output device coupled to said means for processing said output signal, and mounted to an apparatus to be camouflaged, for displaying color in response to said processed output signal from said plurality of said group of linked photodynamic protein-based photodetectors in order to provide adaptive camouflage to said apparatus to be camouflaged, said at least one output device including a visual display device consisting of a passive reflective transducer, and said apparatus to be camouflaged comprising flexible, cloth-like material.

* * * * *